United States Patent [19]
Wellard et al.

[11] Patent Number: 5,012,244
[45] Date of Patent: Apr. 30, 1991

[54] DELTA-SIGMA MODULATOR WITH OSCILLATION DETECT AND RESET CIRCUIT

[75] Inventors: David R. Wellard, Limerick, Ireland; Donald A. Kerth; Bruce P. Del Signore, both of Austin, Tex.; Eric J. Swanson, Buda, all of Tex.

[73] Assignee: Crystal Semiconductor Corporation, Austin, Tex.

[21] Appl. No.: 429,214

[22] Filed: Oct. 27, 1989

[51] Int. Cl.$^5$ .............................................. H03M 3/00
[52] U.S. Cl. .................................... 341/143; 341/120; 341/166
[58] Field of Search .................. 341/120, 143, 166

[56] References Cited

U.S. PATENT DOCUMENTS

| | | | |
|---|---|---|---|
| 4,107,669 | 8/1978 | Tewksbury | 341/143 |
| 4,301,446 | 11/1981 | Petit | 341/143 |
| 4,509,037 | 4/1985 | Harris | 341/166 |

Primary Examiner—A. D. Pellinen
Assistant Examiner—Marc S. Hoff
Attorney, Agent, or Firm—Gregory M. Howison

[57] ABSTRACT

An oscillation detect and reset circuit is provided for an analog modulator that includes a first stage of integration having a single ended differential amplifier (32) which is connected to the input of three stages of subsequent integration (40), (42) and (44), in a cascaded configuration. The output of the last stage of integration (44) is connected to the input of a one-bit quantizer (48). The output of the one-bit quantizer (48) is connected to the input of a current (50) feedback, which is connected between a summing node (36) and a negative voltage supply. The summing node (36) sums the current feedback with an input voltage for input to the amplifier (32). Switches (52), (54) and (56) are provided across the inputs and outputs of the integration stages (40), (42) and (44), respectively. The sensing of an unstable condition on the output of second stage of integration (40) is detected by oscillation detect comparators (60) and (62) to initiate a count cycle in a five-bit counter (66). The output of counter (66) generates a oscillation detect signal upon detection of an oscillation, which signal is output to the control inputs of the switches (52), (54) and (56), for thirty-two cycles of the analog modulator sampling frequency. This is a sufficient amount of time to allow the loop, which is a first order loop, to zero out during the reset period.

28 Claims, 4 Drawing Sheets

DELTA-SIGMA MODULATOR WITH OSCILLATION DETECT AND RESET CIRCUIT

TECHNICAL FIELD OF THE INVENTION

The present invention pertains in general to analog-to-digital converters and, more particularly, to the use of a delta-sigma modulator with circuitry to detect instabilities in the modulator and to reset the modulator to a stable operating condition.

CROSS REFERENCE TO RELATED APPLICATION

This application is related to U.S. Patent Application Ser. No. 205,996, filed June 13, 1988, and entitled CHOPPER STABILIZED DELTA-SIGMA ANALOG-TO-DIGITAL CONVERTER, now U.S. Patent Application No. 4,939,516, 07/428,396 filed Oct. 27, 1989, entitled COMBINING CONTINUOUS TIME AND DISCRETE TIME SIGNAL PROCESSING IN A DELTA-SIGMA MODULATOR (Atty. Dkt. No. CRY-P1019A), U.S. Patent Application Ser. No. 07/428,397, filed Oct. 27, 1989 entitled COMBINING FULLY-DIFFERENTIAL AND SINGLE-ENDED SIGNAL PROCESSING IN A DELTA-SIGMA MODULATOR, and U.S. Patent Application Ser. No., 429,211 filed Oct. 27, 1989 and entitled DELTA-SIGMA ANALOG-TO-DIGITAL CONVERTER WITH CHOPPER STABILIZATION AT THE SAMPLING FREQUENCY (Atty. Dkt. No. CRYS-18,934).

BACKGROUND OF THE INVENTION

Over sampled analog-to-digital converters have been realized with analog modulators utilizing delta-sigma conversion. The analog-to-digital converter consists generally of a delta-sigma modulator and a digital filter. The delta-sigma modulator has a low resolution quantizer embedded therein, around which frequency dependent feedback is applied by means of a digital-to-analog converter and an analog filter. The analog input is summed into the modulator loop at a point where, for frequencies with high loop gain, the output of the DAC will be substantially equal to the input.

Since the quantizer is generally non-linear, exact analysis of the loop parameters is difficult. Typically, it is desirable in the design of a delta-sigma modulator to reduce quantization noise, which can be achieved by the selection of a transfer function for the overall modulator that possesses high in-band gain and high out-of-band attenuation, thereby shaping the quantization noise spectrum advantageously.

The filter function is normally realized with at least one integrator and sometimes a cascade of two integrators, the cascade of two integrators providing a "second order" filter, which second order filter more effectively shifts quantization noise to out-of-band frequencies. Extension to higher order filters, although improving the quantization noise, has substantially more stability problems associated therewith. These higher order filters are generally only conditionally stable due to the existence of a high phase shift at baseband frequencies. Conditionally stable loops can become unstable if a frequency independent gain parameter in the loop is reduced. The effective quantizer gain is such a parameter and this gain is subject to change under varying operating conditions. As such, stability of modulators with third and higher order filters is at risk. Nevertheless, the attractiveness of higher order filters has led to a number of solutions to the stability problems.

Stability problems can exist in higher order modulators and as a result of large DC or high frequency inputs during power-up or other system transients. One solution that has been proposed to solve this problem is that illustrated and disclosed in U.S. Pat. No. 4,509,037, issued to Harris. Harris discloses a clipper circuit which is disposed between the input and the output of one of the integration stages in the higher order modulator which, when large signals are present, shorts out the integrator to basically change the poles and zeroes of the filter function. However, this type of system has some problems in that it is unknown exactly what changes occur at clipping due to the non-linearities of the diodes utilized in the clipping circuit and also the length of time required for the modulator to settle back to its normal operating condition. There therefore exists the need for an improved oscillation detection and reset circuit.

SUMMARY OF THE INVENTION

The present invention disclosed and claimed herein comprises an instability detect/correction circuit for an analog modulator. The analog modulator includes at least two cascaded integration stages which normally operate in a stable mode. A comparator circuit is provided for comparing the operating characteristics of the modulator with a pre-determined stability reference to determine if the modulator is operating at or near an unstable condition. When it is determined that the modulator is at or near an unstable condition, an instability detect signal is generated for a pre-determined amount of time. A zeroing circuit is disposed on at least one of the integration stages and is operable to substantially zero the associated integration stage to remove accumulated information therefrom, the zeroing circuit operating in response to generation of the instability detect signal.

In another aspect of the present invention, the comparator measures the output of one of the integration stages and compares it with a predetermined threshold. When the output exceeds the predetermined threshold, this represents a condition at or near an unstable condition.

In another aspect of the present invention, the zeroing circuit is comprised of a switch disposed on one of the integration stages between the input and the output thereof. The switch is operable in the closed position to substantially zero the integration stage to remove the accumulated information therefrom. In one embodiment, the switches are connected between the input and output of each of the integration stages. In a second embodiment, the switches are connected across all of the integration stages with the exception of the first integration stage. In the presence of the instability detect signal in the second embodiment, the analog modulator operates as a first order analog modulator. The instability detect signal is generated for a sufficient amount of time to allow the first stage of integration to enter a stable operating region, at which time the instability detect signal is removed and the switches are opened.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
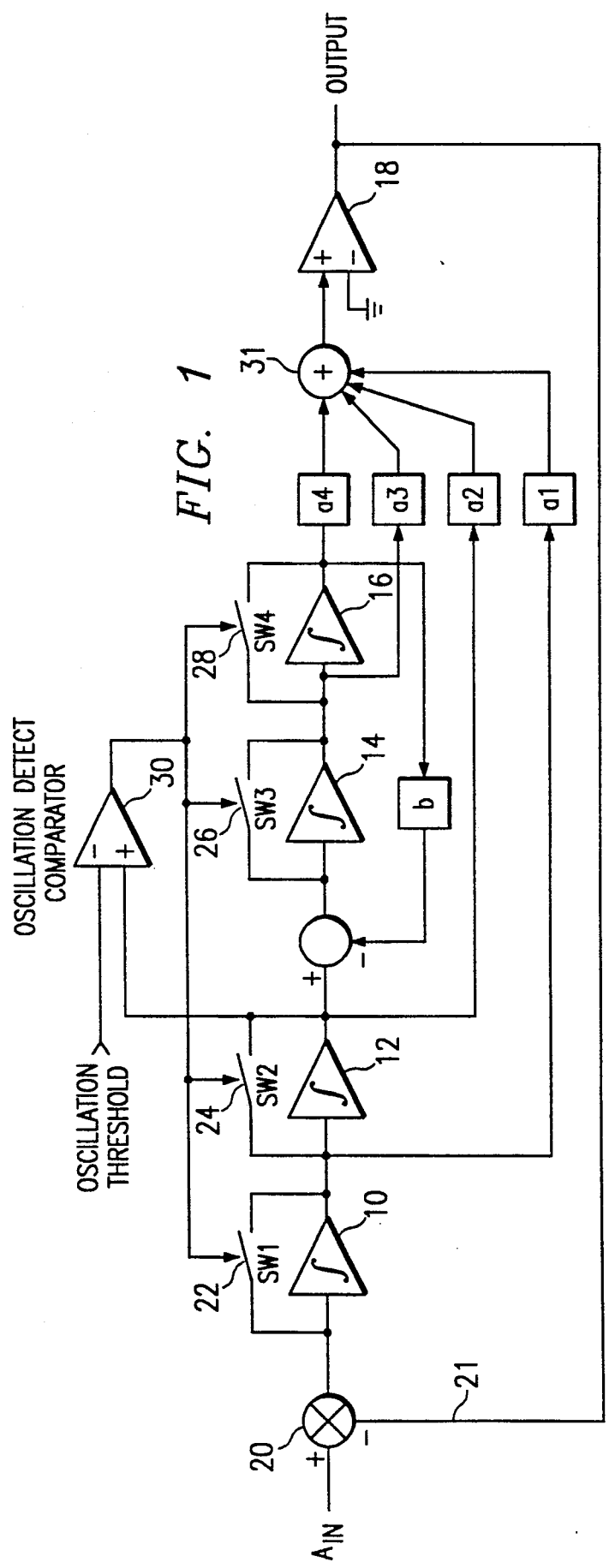
FIG. 1 illustrates a block diagram of a high order delta-sigma modulator utilizing an oscillation detect and reset circuit.

Referring now to FIG. 1, there is illustrated a block diagram of an analog modulator utilizing delta-sigma conversion. The delta-sigma modulator is a fourth order modulator which is comprised of a first stage of integration 10 which, in this embodiment, has a single-ended output and operates in a continuous time mode. However, it should be understood that the first stage of integration could also be a discrete switched-capacitor integrator. The output of integrator 10 is input to a second stage of integration 12 which subsequently is input to two additional stages of integration 14 and 16, integrators 10-16 being cascaded The stages of integration 12-16 operate in a switched capacitor mode. The output of integrator 16 is input to a one bit quantizer which is realized with a sampling comparator 18. The output is then summed in a summing junction 20 through feedback line 22. This provides a one bit digital-to-analog converter feedback. In the preferred embodiment, this is a current feedback The summing junction 20 receives on the other input thereof the analog input voltage and sums the analog input voltage with the one bit DAC signal on line 22 for input to the first stage of integration 10. The detailed operation of the analog modulator of FIG. 1 is described in co-pending application Ser. No. 07/429,211 entitled "Delta-Sigma Analog-to-Digital Converter With Chopper Stabilization at the Sampling Frequency", filed Oct. 27, 1989 (Atty. Dkt. No. CRYS-18,934), which is incorporated herein by reference.

Referring further to FIG. 1, each of the integrators 10-16 has associated therewith switches 22, 24, 26 and 28, respectively. Each of the switches 22-20 are connected between the input and output of the respective integrators 10-16. The control inputs to each of the switches 22-28 are connected to the output of an oscillation detect comparator 30, which has the input thereof connected to the output of the second integrator 12 and the threshold input thereof connected to an oscillation threshold voltage. Feedforward paths a1-a4 are provided from the outputs of the integrators 10-16 to a summing junction 31 on the input to comparator 18 and a feedback path b is provided between integrator 16 and integrator 14 for loop stability.

The switches 22-28 function to reset each of the integrators 10-16 to a zero value in the event that an unstable condition exists in the loop. This unstable condition may be due to large DC or high frequency inputs during powerup or other system transients. Although the loop is designed under normal input voltages to operate in a stable region, the gain of the loop varies as a function of the input and, as such, it can enter an unstable operating area. When this unstable operating area is entered, it has been determined empirically and through simulations that the stage of integration to first exhibit this non-linearity will be the second stage of integration 12. Therefore, the input to the oscillation detect comparator 30 is connected to the output of the second stage of integration 12. However, it should be understood that the input of the oscillation detect comparator 30 can be connected to the output of any of the integrators 10-16. Further, it should also be understood that other parameters of the loop can be monitored to determine if a change in those parameters indicates an unstable mode. It is therefore the purpose of the oscillation detect comparator to determine the presence of this instability or even the presence of a stable operating condition that borders on instabilities.

When the oscillation detect comparator 30 detects an unstable condition, it closes switches 22-28. This results in the removal of all accumulated information in each of the integrators, setting them to zero. However, during this reset period the modulator is unable to process data.

Figure 2:
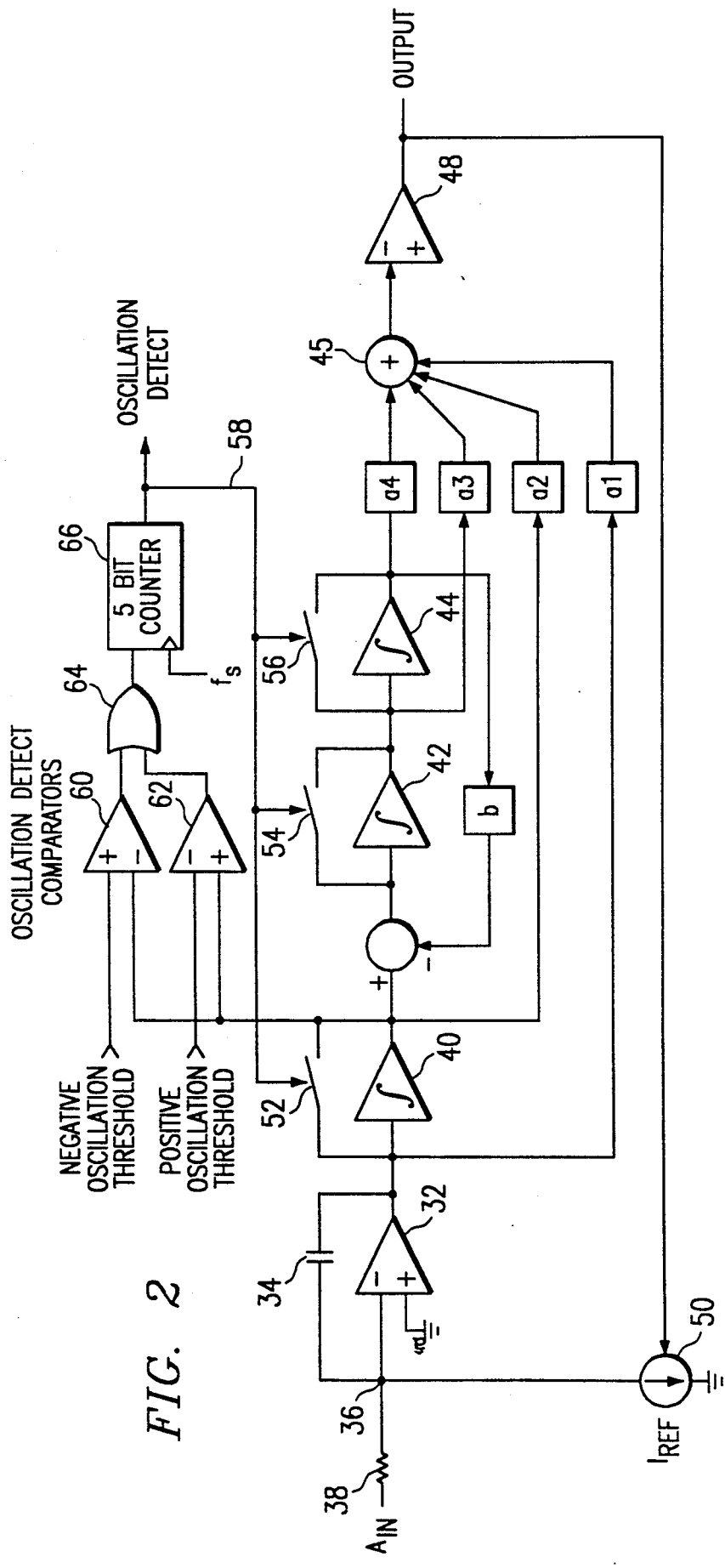
FIG. 2 illustrates an alternate embodiment of the oscillation detect and reset circuit of FIG. 1.

Referring now to FIG. 2, there is illustrated a second and preferred embodiment of the present invention. The embodiment of FIG. 1, although operable to detect the oscillation and reset the modulator back to a stable operating region, has two limitations. First, it does not process data during the reset mode and, second, the parasitics of the switch 22 associated with the first stage of integration 10 can itself introduce noise into the modulator loop, which is undesirable for high resolution analog to digital converters.

The analog modulator of FIG. 2 incorporates a first stage of integration comprised of a single-ended differential amplifier 32 which operates in a continuous mode. The amplifier 32 has a integration capacitor 34 connected between the negative input and the output thereof and the positive input thereof is connected to a ground. The analog input voltage is input to a summing node 36 through a resistor 38.

The output of the amplifier 32 is input to a second stage of integration 40 the second stage of integration 40, output to a third stage of integration 42 and third stage of integration 42 output to a fourth stage of integration 44. The second, third and fourth stages of integration 40-44 are similar to the second third and fourth stages of integration 12-16 of FIG. 1. The output of the fourth stage of integration 44 is input to a sampling comparator 48, similar to the sampling comparator 18. The output of comparator 48, which provides the one-bit quantizer function, is connected through a current feedback loop to a current reference 50 which is connected between the summing node 36 and ground. The current reference 50 and the connection thereof to the output of the sampling comparator 48 provides the one-bit DAC operation. This is achieved through current feedback, which is described in detail in co-pending U.S. Patent Application Ser. No. 07/428,396, filed concurrent herewith and entitled Combining Continuous Time and Discrete Time Signal Processing in a Delta-Sigma Modulator (Atty. Dkt. No. CRY-P1019A), which is incorporated herein by reference.

The first stage of integration incorporating the amplifier 32 does not have a switch disposed across the input and output thereof as was the case with the first stage of integration 10 in FIG. 1. Rather, switches 52, 54, and 56 are provided only in association with the second stage of integration 40, the third stage of integration 42 and the fourth stage of integration 44, respectively. Each of these switches 52-56 are disposed between the input and output of the respective stages of integration 40-44. They are similar in function to the integration stages 12-16, respectively in that they operate in a switched capacitor discrete mode. The operation of the integration stages are described in U.S. Patent Application Ser. No. 07/429,211 (Atty. Dkt. CRYS-18934). Feedforward paths a1-a4 are provided between the outputs of integrators 32-44 to a summing junction 45 on the input to comparator 48 and a feedback path b is provided between integrators 42 and 44 for loop stability.

The switches 52-56 are controlled through a common control line 58 and are realized with a series MOS transistor, the gate of which is connected to line 58. For low noise operation, a relatively high gain input stage of integration is required which would require a relatively large capacitor 34. In order to set such a capacitor to a zero value during oscillation with the use of a switch, as described with respect to the embodiment of FIG. 1, a relatively low resistance switch would be required. Such a low resistance switch, when realized with an MOS transistor, would result in large parasitics disposed on the input and output of the amplifier 32. For the later stages of integration, large capacitors are not present and the switches 52-56 are not required to be as low resistance, therefore, they can utilized MOS transistors. However, it is still necessary to zero the input stage of integration utilizing the amplifier 32.

When an oscillation condition is detected and the switches 52-56 are closed, this results in the loop being comprised of the amplifier 32 in the first stage of integration connected directly to the input of the sampling comparator 48, i.e. the loop becomes a first order loop. First order loops are inherently stable and, as such, the first order loop will zero itself out. However, this zeroing function will take a predetermined amount of time.

To properly zero out the loop, the oscillation detect function is implemented with two oscillation detect comparators 60 and 62. The oscillation detect comparator 60 compares the output of the second stage of integration 40 with a negative oscillation threshold, and the oscillation detect comparator 62 compares the output of the second stage of integration 40 with a positive oscillation threshold. If the output exceeds either threshold, a separate output signal is generated, which output signals are input through an OR gate 64, the output of which is connected to the input of a five-bit counter 66. The counter 66 is clocked by the sampling frequency $F_s$. Additionally, the counter 66 is also reset to a zero value and then counts upward from zero value to a value of 31, resulting in a total of 32 $F_s$ cycles to provide a full count. An oscillation detect signal is generated on the output of the counter 66 when an unstable operating condition is detected, and the counter 66 is reset. At full count, the oscillation detect signal on the output of counter 66 is removed. However, until an output signal is detected from the OR gate 64, the counter 66 is disabled and no output will be generated therefrom.

It is necessary to provide a delay in order to allow the loop with the switches 52-56 to zero out. The switches 52-56 by definition zero out the integration stages 40-44, since they remove all accumulated data therefrom. The first stage of integration comprised of the amplifier 32 is not initially zeroed and must be allowed to zero out through the dynamics of the loop. It has been determined empirically for a worst case condition that 32 cycles of the sampling clock $F_s$ are required to achieve this zeroing function. As such, the five-bit counter 66 is provided. However, depending on the loop dynamics, a longer or shorter time may be required. Further, this amount of time could be dynamically altered such that the time is a function of the type of instability, the level of instability, etc.

Figure 3:
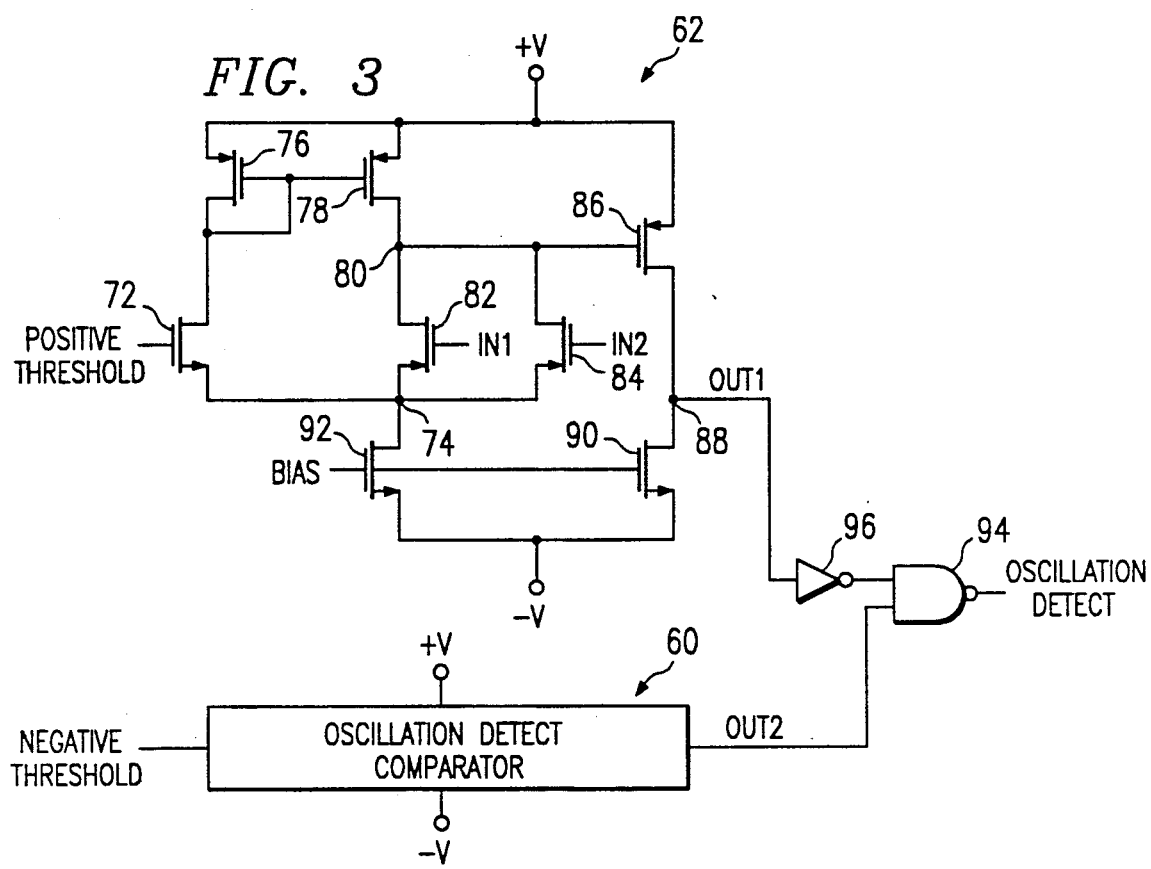
FIG. 3 illustrates a schematic diagram of the oscillation detect circuit of FIG. 2.

Referring now to FIG. 3, there is illustrated a schematic diagram of the oscillation detect comparators 60 and 62 and the OR gate 64. The schematic for the oscillation detect comparator 62 is illustrated in detail. It includes an N-channel transistor 72 having the drain thereof connecting to a node 74 and to the drain of a P-channel transistor 76. Transistor 76 is diode connected with the gate and drain thereof tied together. The source of transistor 76 is connected to a positive supply voltage. A P-channel transistor 78 is provided having the gate thereof connected to the gate of transistor 76, the source thereof tied to the positive supply voltage and the drain thereof connected to a node 80. An N-channel transistor 82 has the drain thereof connected to the node 82 and the source thereof connected to the node 74. The gate of transistor 82 is connected to an input signal IN1. In a similar manner, an N-channel transistor 84 is provided having the drain thereof connected to the node 80 and the source thereof connected to the node 74. The gate of transistor 84 is connected to an input signal IN2. The input signals IN1 and IN2 represent the differential output of the second stage of integration 40, which incorporates a differential amplifier therein.

The node 80 is connected to the gate of an output P-channel transistor 86, transistor 86 having the drain thereof connected to an output node 88 and the source thereof connected to the positive supply voltage. An output N-channel transistor 90 has the drain thereof connected to the node 88 and the source thereof connected to the negative supply voltage. In a similar manner, an N-channel transistor 92 is provided having the drain thereof connected to the node 74 and the source thereof connected to the negative supply voltage. The gates of transistors 90 and 92 are connected to a bias reference voltage.

The output node 88 provides the output signal OUT1, which is connected to one input of a two input NAND gate 94 through an inverter 96. The other input of the NAND gate 94 is connected to the output of the negative threshold oscillation detect comparator 60, the output signal OUT2.

The positive oscillation detect comparator 62 has the gate of the transistor 72 connected to the positive oscillation threshold voltage. The oscillation detect comparator 60 is the mirror of the positive oscillation detect comparator 62, with the transistor therein corresponding to the transistor 72 being connected to the negative oscillation threshold voltage. When the differential voltage across the inputs IN1 and IN2 in either of the oscillation detect comparators 60 or 62 exceeds the associated threshold voltage, the respective output voltage OUT1 or OUT2 changes. For the positive oscillation detect comparator 62, if IN1 or IN2 is greater than the positive threshold, OUT1 goes high. For the negative oscillation detect comparator 60 if IN1 or IN2 is less than the negative threshold, OUT2 goes low. Either of these conditions results in a change in the logic state in the output of the NAND gate 94 from a logic low to a logic high.

The positive and negative oscillation thresholds are derived from an MOS voltage divider. Typically, the voltage divider is comprised of a series connection of N-channel and P-channel transistors, with the voltages also utilized for other bias levels in the circuit. This is a conventional circuit and is not illustrated.

Figure 4:
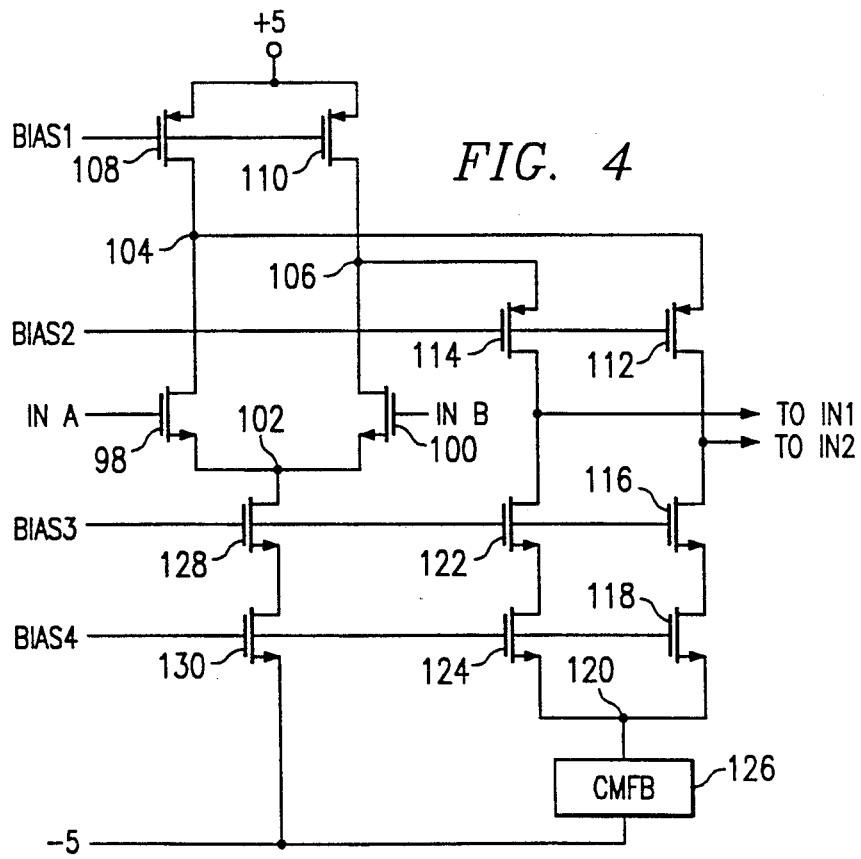
FIG. 4 illustrates a simplified schematic of one stage of integration, the output of which is detected by the oscillation detect circuit.

Referring now to FIG. 4, there is illustrated a simplified schematic diagram of the differential amplifier for the second stage of integration 40. The input to the differential amplifier is comprised of two signals INA and INB. INA is input to the gate of an N-channel transistor 98 and the input signal INB is input to the gate of an N-channel transistor 100. Transistors 98 and 100 are configured in a differential manner with the sources thereof tied together to a node 102. The drain of transistor 98 is connected to an output node 104 and the drain of transistor 100 is connected to an output node 106. A P-channel load transistor 108 is provided having the source-to-drain path thereof connected between output node 104 and the positive supply voltage. In a similar manner, a P-channel load transistor 110 has the source-to-drain path connected between node 106 and the positive supply voltage. The gates of transistors 108 and 110 are connected to a bias supply voltage.

The output nodes 104 and 106 are connected to the sources of P-channel transistors 112 and 114, respectively. The gates of transistors 112 and 114 are connected to a bias supply voltage BIAS2, which also comprises the positive oscillation threshold voltage. The drains of transistors 112 and 114 provide the output voltages IN2 and IN1, respectively. The drain of transistor 112 is connected through two series connected N-channel transistors 116 and 118 to a current node 120. The drain of transistor 114 is connected in a similar manner through two series connected N-channel transistors 122 and 124 to the current node 120. Current node 120 is connected to the negative supply voltage through a common mode feedback circuit 126. The node 102 is similarly connected through two series N-channel transistors 128 and 130 to the negative supply voltage. The gates of transistors 116, 122 and 128 are connected to a bias voltage BIAS3, BIAS3 also providing the negative oscillation threshold voltage. The transistors 118, 124 and 130 having gates thereof tied together and connected to a bias voltage BIAS4.

Figure 5:
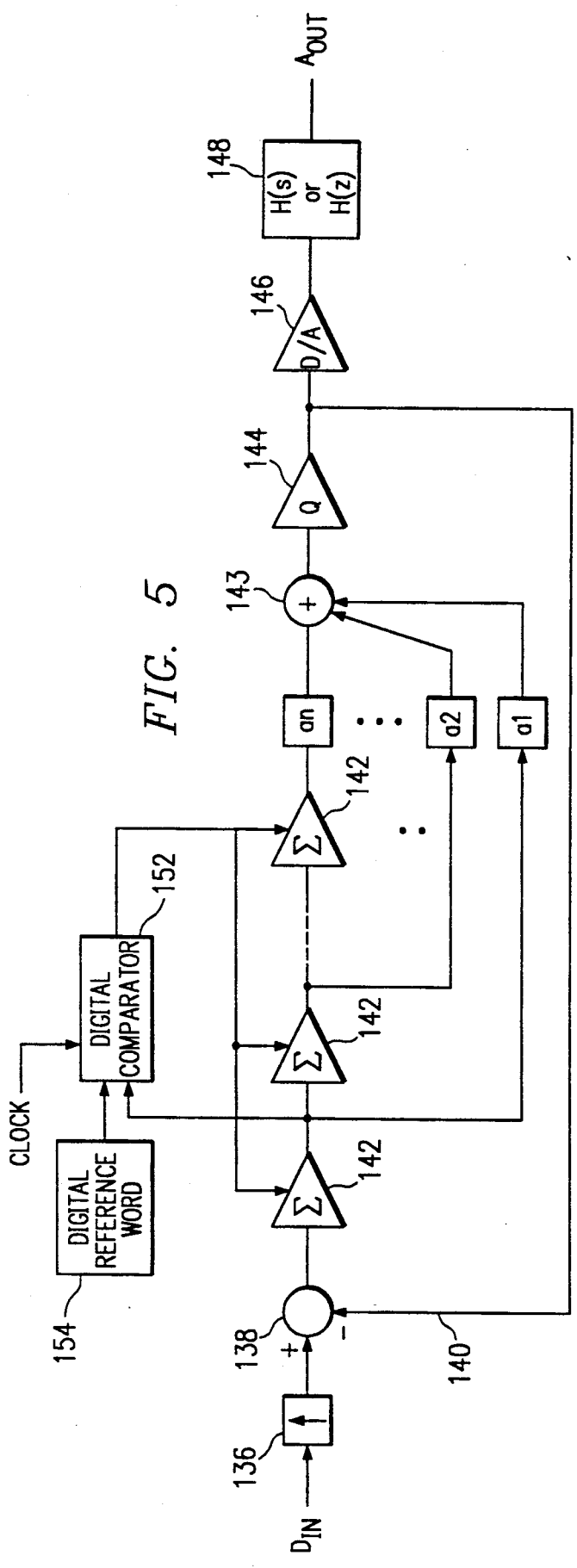
FIGS. 5 and 5a illustrate a digital-to-analog implementation of the oscillation detect and reset circuit.

In an alternate embodiment of the present invention, a digital-to-analog converter (D/A) is illustrated utilizing the stability detection and reset circuitry. A delta-sigma converter can be utilized both for an analog-to-digital converter and also for digital-to-analog converter. The D/A converter utilizing the delta-sigma converter is illustrated in FIG. 5. A digital input signal is input to an interpolator 136. The interpolator 136 is operable to increase the incoming and digital word rate by some oversampling ratio. The interpolator 136 is not a portion of the delta-sigma modulator. The output of the interpolator 136 is input to a summing block 138, the other input of which is connected to a feedback path 140.

The summing block 138 is input to a loop filter which is comprised of a plurality of accumulators 142. The loop filter comprised of the accumulators 142 is of the structure typically seen in the analog modulators. They can form a first, second or nth order loop filter. However, stability problems are similar to that experienced by analog modulators.

The output of the last accumulator 142 in the loop filter is input to a quantizer 144 which, in one embodiment, is a one-bit quantizer. With the one-bit quantizer, the sign bit from the output of the loop filter is only kept and then fed back to the input to the summing junction 138 through the feedback line 140. Alternatively, multiple bit quantizers can also be utilized but this provides a more complicated post analog processing scheme. Feedforward paths a1-an are provided between the outputs of integrators 142 and a summing junction 143 on the input to quantizer 144 for loop stability.

With the one-bit quantizer 144, a one-bit D/A 146 is utilized. The output of the D/A 146 is input to an analog filter 148, the output of which provides the analog output. This can be a discrete time filter with a transfer function H(z) or a continuous time filter with a transfer function H(s) or a combination of both. This filter is utilized to remove the high frequency noise and average the one-bit digital word.

The delta-sigma digital modulator is an exact dual of the delta-sigma analog modulator. Additionally, the post analog filter is an exact dual of the post digital filter needed in conventional delta-sigma A/D converters. To facilitate the oscillation detect and reset circuitry, a digital comparator 152 is provided which receives the output of one of the accumulators 142 and compares it with a digital reference word represented by block 154. The digital comparator 152 is clocked with the system clock and, when an unstable condition is detected, as determined by the digital reference word in block 154, a Stability Reset signal is generated. The Stability Reset signal is input to a reset input on each of the accumulators 142 such that the output thereof is set to a zero value. Although the stability Reset Signal is illustrated as being input to each of the accumulators 142, it should be understood that the first accumulator 142 in the loop filter could be configured so as not to reset in the event of an instability. In this condition, the delta-sigma digital modulator would operate as a lower order modulator during the reset operation.

Figure 5A:
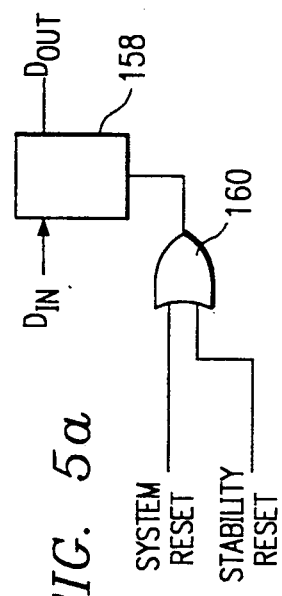

Referring now to FIG. 5a, there is illustrated a detail of the reset operation. Basically, the output of each of the accumlators 142 is comprised of a flip flop register 158. The reset input on the flip flop 158 is connected to the output of an OR gate 160. OR gate 160 has one input thereof connected to the System Reset signal and the other input thereof connected to the Stability Reset signal output by the digital comparator 152. Therefore, when the Stability Reset signal is generated, the data output of flip flop register 158 is set to 0.

In summary, there has been provided an oscillation detect and reset circuit for a delta-sigma analog modulator. The analog modulator is a high order modulator having multiple stages of integration. Switches are provided which are operable to selectively connect the output of the integration stage to the input thereof in the event that an unstable condition is detected. This results in zeroing out of the integration by removing all accumulated information therein. In one mode, the switches are only disposed on the second and later stages of integration and maintained for a predetermined amount of time in a closed state until the loop settles out, with the first stage of integration providing a first order response during the settling period.

Although the preferred embodiment has been described in detail, it should be understood that various changes, substitutions and alterations can be made therein without departing from the spirit and scope of the invention as defined by the appended claims.

What is claimed is:

1. An instability detect/correction circuit for an analog modulator in an analog-to-digital converter, the analog modulator having at least two cascaded filter sections, the detect/correction circuit comprising:
- a comparator circuit for comparing the operating characteristics of the modulator with a predetermined reference to determine if the analog modulator is operating at or near an unstable condition;
- at least one zeroing circuit disposed on at least one of the filter sections and operable to substantially zero the associated filter section to remove accumulated information therefrom, said zeroing circuit operating in response to generation of an instability detection signal; and
- a control circuit for generating said instability detection signal for a predetermined amount of time in response to said comparator circuit determining that the modulator is operating at or near an unstable condition.

2. The detect/correction circuit of claim 1 wherein each of said filter sections include an integrator, and said comparator circuit measures the output level of one of the integrators and compares it with said predetermined stability reference and, if said measured output exceeds said predetermined stability reference, a true comparison signal is generated by said comparator, said true comparison signal indicating that the modulator is operating at or near an unstable condition.

3. The detect/correction circuit of claim 1 wherein said unstable condition comprises oscillation of the modulator.

4. The detect/correction circuit of claim 1 wherein said comparator circuit is operable to determine only if the modulator is operating in an unstable condition.

5. The detection/correction circuit of claim 1 wherein at least one of the filter sections includes an integrator and said zeroing circuit comprises a switch being disposed between the input and the output of said integrator, said switch being closed in response to the generation of said instability detection signal.

6. The detect/correction circuit of claim 5 wherein each of the filter sections includes an integrator, each integrator having a switch disposed between the input and output thereof and operable to be closed in response to generation of said instability detection signal.

7. The detect/correction circuit of claim 1 wherein said zeroing circuit is disposed on all of said filter sections not including the first filter section, with the first filter section allowed to operate when said zeroing circuits are operating in response to generation of said instability detection signal, such that the first filter section operates during the zeroing operation to form a first order loop.

8. The detect/correction circuit of claim 7 wherein the predetermined amount of time during which said control circuit generates said instability detection signal is sufficient to allow the first filter section to reach a stable operating condition.

9. An instability detect/correction circuit for an analog modulator, the analog modulator having at least two cascaded filter sections, the detect/correction circuit comprising:
- a switch disposed between the input and output of all of the cascaded filter sections with the exception of the first filter section, said switch operable to be in a closed position in response to the presence of an instability detect signal, the switch operable to substantially zero the associated one of the filter sections to remove accumulated information therefrom;
- an instability detect circuit of detecting whether the modulator is operating at or near an unstable condition whereupon said instability detect signal is generated; and
- a timer for maintaining the presence of said instability detect signal for a predetermined amount of time to allow said first filter section to reach a stable operating condition.

10. The detect/correction circuit of claim 9 wherein said instability detection circuit is comprised of a comparator for comparing the output of at least the second of the integration stages with a predetermined stability threshold and generating said instability detect signal when the output of the measured one of the cascaded filter sections exceeds said stability threshold.

11. The detect/correction circuit of claim 9 wherein the analog modulator includes a plurality of cascaded filter sections with said switches being disposed on all of said filter sections with the exception of the first filter section.

12. A detection/correction method for detecting instabilities in an analog modulator and correcting these instabilities, the analog modulator having at least two cascaded filter sections, the method comprising the steps of:
- monitoring the operating characteristics of the analog modulator;
- comparing the operating characteristics of the analog modulator with a predetermined stability reference to determine if the modulator is operating at or near an unstable condition as defined by the predetermined stability reference;
- generating an instability detect signal for a predetermined amount of time when it is determined that the analog modulator is operating at or near an unstable condition; and
- controlling at least one of the filter sections to substantially zero the filter section to remove accumulated information therefrom in response to the presence of the instability detect signal.

13. The method of claim 12 wherein the step of determining if the modulator is operating at or near an unstable condition comprises:
- measuring the output level of one of the filter sections;
- comparing the output level of the measured filter sections with said predetermined stability reference; and
- generating the instability detect signal when the measured output of the measured one of the filter sections exceeds the predetermined stability reference.

14. The method of claim 12 wherein the filter sections each include an integrator and the step of zeroing the filter section comprises:
- disposing a switch on at least one of the integrators between the input and the output thereof and normally in an open position; and
- closing the switch when the instability detect signal is generated.

15. The method of claim 14 wherein a switch is disposed on all of the integrators between the input and the output thereof.

16. The method of claim 14 wherein a switch is disposed on all of the integrators except the integrator in the first filter section.

17. The method of claim 16 wherein the analog modulator operates as a first order modulator during the presence of the instability detect signal and the predetermined amount of time during which the instability detect signal is generated is sufficient to allow the first filter section to enter a stable operating region.

18. An instability detect/correction circuit for a convertor that converts an input digital or analog format signal to an output analog or digital format signal, respectively, representing the respective input digital or analog format signal, comprising:
- a comparator circuit for comparing the operating characteristics of the convertor with a predetermined reference to determine if the converter is operating at or near an unstable condition;
- at least one zeroing circuit disposed on the converter and operable to substantially zero the converter to remove accumulated information therefrom, said zeroing circuit operating in response to generation of an instability detection signal; and
- a control circuit for generating said instability detection signal for a predetermined amount of time in response to said comparator circuit determining that the converter is operating at or near an unstable condition.

19. The detection/correction circuit of claim 18 wherein the converter comprises a delta-sigma modulator.

20. The detection/correction circuit of claim 19 wherein said delta-sigma modulator is a digital delta-sigma modulator.

21. The detection/correction circuit of claim 17 wherein said delta-sigma modulator comprises an analog delta-sigma modulator.

22. An instability detection/correction circuit for an digital modulator in a digital-to-analog converter, the digital modulator having at least two cascaded filter sections, the detection/correction circuit comprising:
- a comparator circuit for comparing the operating characteristics of the modulator with a predetermined reference to determine if the digital modulator is operating at or near an unstable condition;
- at least one zeroing circuit disposed on at least one of the filter sections and operable to substantially zero the associated filter section to remove accumulated information therefrom, said zeroing circuit operating in response to generation of an instability detection signal; and
- a control circuit for generating said instability detection signal for a predetermined amount of time in response to said comparator circuit determining that the modulator is operating at or near an unstable condition.

23. The detection/correction circuit of claim 22 wherein the filter sections each include an accumulator, and said comparator circuit measures the output level of one of the accumulators and compares it with said predetermined stability reference and, if said measured output exceeds said predetermined stability reference, a true comparison signal is generated by said comparator, said true comparison signal indicating that the modulator is operating at or near an unstable condition.

24. The detection/correction circuit of claim 22 wherein said unstable condition comprises oscillation of the modulator.

25. The detection/correction circuit of claim 22 wherein said comparator circuit is operable to determine only if the modulator is operating in an unstable condition.

26. The detection/correction circuit of claim 22 wherein at least one of the filter sections includes an accumulator and said zeroing circuit comprises a reset circuit for resetting the output of the integrator to zero in response to the generation of said instability detection signal.

27. The detect/correction circuit of claim 25 wherein each of the filter sections includes an accumulator, each accumulator having a reset circuit operable to be activated in response to generation of said instability detection signal.

28. The detection/correction circuit of claim 22 wherein said zeroing circuit is disposed on all of said filter sections after and not including the first filter section with the first filter section allowed to operate when said zeroing circuits are operating in response to generation of said instability detection signal, such that the first filter section operates during the zeroing operation to form a first order loop.

* * * * *

UNITED STATES PATENT AND TRADEMARK OFFICE
CERTIFICATE OF CORRECTION

PATENT NO. : 5,012,244

DATED : April 30, 1991

INVENTOR(S) : David R. Welland, Donald A. Kerth, Bruce P. Del Signore and Eric J. Swanson It is certified that error appears in the above-identified patent and that said Letters Patent is hereby corrected as shown below:

ON THE TITLE PAGE: Items [19] and [75]

Change "Wellard et al." to

--Welland et al.--

Change "David R. Wellard" to

--David R. Welland--

Signed and Sealed this

Twelfth Day of January, 1993

*Attest:*

*Attesting Officer*

DOUGLAS B. COMER

*Acting Commissioner of Patents and Trademarks*